US 6,548,115 B1

(12) United States Patent
Gibson et al.

(10) Patent No.: US 6,548,115 B1
(45) Date of Patent: Apr. 15, 2003

(54) SYSTEM AND METHOD FOR PROVIDING COATING OF SUBSTRATES

(75) Inventors: Gregory M. Gibson, Dallas, TX (US); James J. Costa, Middleton, MA (US)

(73) Assignee: FAStar, Ltd., Dallas, TX (US)

( * ) Notice: Subject to any disclaimer, the term of this patent is extended or adjusted under 35 U.S.C. 154(b) by 0 days.

(21) Appl. No.: 09/201,543

(22) Filed: Nov. 30, 1998

(51) Int. Cl.$^7$ .................................................. B05D 1/32
(52) U.S. Cl. ........................ 427/282; 118/406; 118/301; 438/943; 438/945
(58) Field of Search ................. 118/406, 301, 118/321, 319, 410, 320, 504, 505, 52, 70, 323; 427/240, 273, 425, 282, 424; 134/153, 154; 438/758, 943, 945; 101/121, 122, 127

(56) References Cited

U.S. PATENT DOCUMENTS

| | | | | |
|---|---|---|---|---|
| 3,148,085 A | * | 9/1964 | Wiegmann | 118/301 X |
| 3,494,326 A | * | 2/1970 | Upton | 118/52 X |
| 3,538,883 A | * | 11/1970 | Poliu | 118/52 X |
| 3,584,599 A | * | 6/1971 | Chasfan | 118/301 |
| 4,024,835 A | * | 5/1977 | Scheu et al. | |
| 4,096,821 A | * | 6/1978 | Greeweich et al. | 118/10 |
| 4,692,351 A | | 9/1987 | Maeda et al. | 427/196 |
| 4,875,434 A | * | 10/1989 | Maejima et al. | |
| 5,415,717 A | * | 5/1995 | Perneboen | 118/301 X |
| 5,489,337 A | * | 2/1996 | Nomura et al. | |
| 5,608,943 A | | 3/1997 | Konishi et al. | 15/302 |
| 5,688,411 A | | 11/1997 | Kutsuzawa et al. | 216/92 |
| 5,772,764 A | * | 6/1998 | Akimoto | 118/52 X |
| 5,779,799 A | * | 7/1998 | Davis | 118/52 X |
| 5,919,520 A | * | 7/1999 | Tateyama et al. | 427/240 |
| 5,952,050 A | * | 9/1999 | Doan | 118/52 X |
| 6,013,315 A | * | 1/2000 | Mandal | |

FOREIGN PATENT DOCUMENTS

| | | | | |
|---|---|---|---|---|
| JP | 7142439 | 6/1995 | | H01L/21/304 |
| JP | 8250390 | 9/1996 | | H01L/21/027 |

OTHER PUBLICATIONS

International Search Report, PCT/US99/26706.

* cited by examiner

Primary Examiner—Brenda A. Lamb
(74) Attorney, Agent, or Firm—Winstead Sechrest & Minick, P.C.; Henry L. Ehrlich

(57) ABSTRACT

A modular coating apparatus is disclosed which is adapted to couple to a host system, such as a cluster or in-line type coating system, as well as to operate in stand-alone fashion. The coating apparatus uses extrusion to initially deposit a film having a desired thickness. The substrate upon which the film is deposited may be spun to further distribute the film. Various embodiments of the coating apparatus are disclosed including embodiments utilizing a shim to mask the substrate and embodiments utilizing a rotatable chuck to facilitate cleaning of the substrate and/or the chuck. Preferably the various embodiments are sub-modules which may be interchanged in the main module as desired.

27 Claims, 7 Drawing Sheets

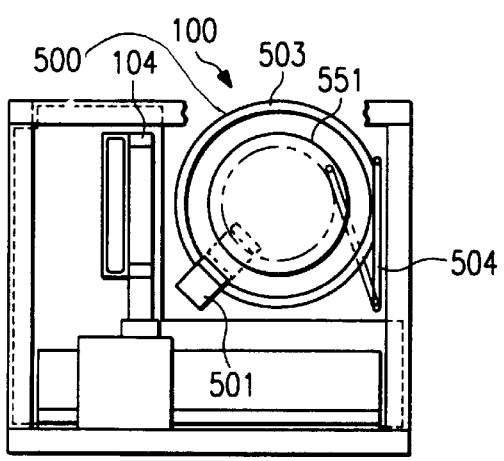
FIG. 5A
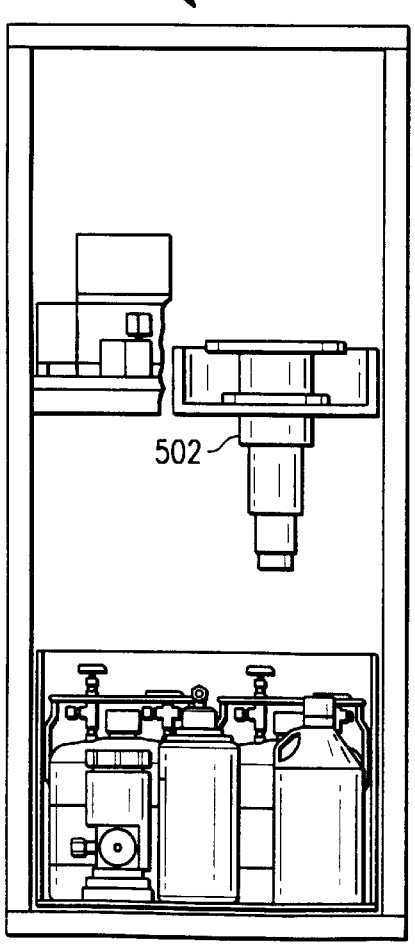
FIG. 5B
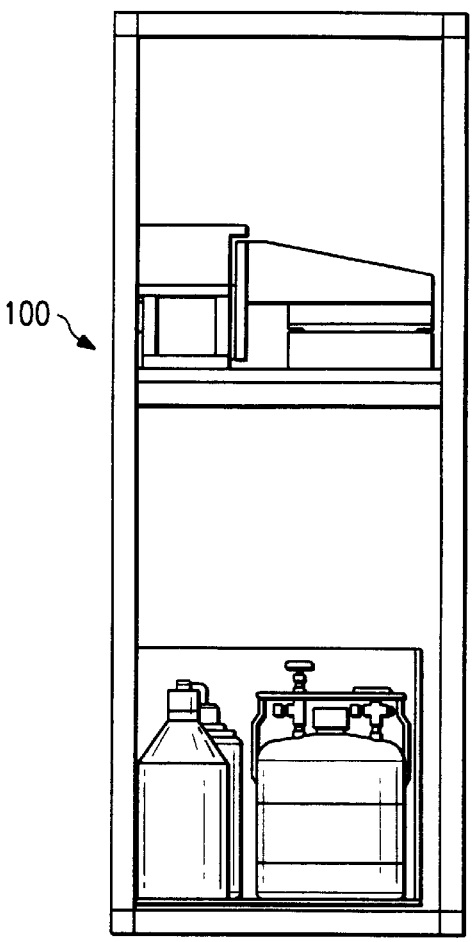
FIG. 5C
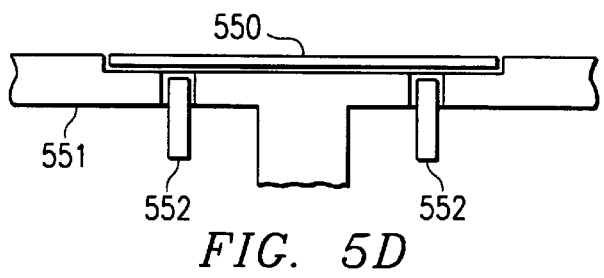
FIG. 5D
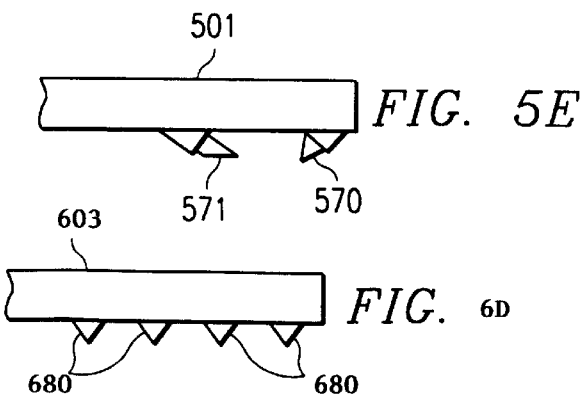
FIG. 5E
FIG. 6D

SYSTEM AND METHOD FOR PROVIDING COATING OF SUBSTRATES

RELATED APPLICATIONS

Reference is hereby made to concurrently filed co-pending and commonly assigned patent application Ser. No. 09/148,463, filed Sep. 4, 1998, entitled "Linear Extrusion Coating System and Method," the disclosure of which application is incorporated herein by reference.

TECHNICAL FIELD OF THE INVENTION

The present invention relates to providing precision coatings to substrates and more particularly to the coating of substrates with modular coating apparatus adapted to provide various desired results including no edge beading, no edge coating, reduced material loss, reduced cleaning solvent usage, and increased processing throughput.

BACKGROUND OF THE INVENTION

Providing coatings of a desired thickness and uniformity on a substrate has been a necessity in many industries, most notably in the processing of silicon wafers to produce integrated circuits ("chips"). For example, in the production of chips, a wafer may be coated with photoresist in order to develop a mask for controlling the introduction of dopants into or onto the wafer. However, due to the typically very large scale integration of electrical components (often in the hundreds of thousands and even in the millions) integrated into a single chip, many of which are produced from a single wafer, tolerances with respect to providing these coatings are very narrow. Likewise, as particular areas to be defined by such coatings may be very small, such as on an order of magnitude equivalent with the wavelength of light, the cleanliness and purity requirements of such coatings and coating processes are high. Moreover, the chemicals used are often very costly and/or very volatile and, therefore, it is generally desired that their use, dispensation, and handling be strictly controlled so as to not unnecessarily waste such chemicals and/or cause additional costs in their clean-up and subsequent handling in addition to environmental concerns.

The current state of the art in coating wafers is to provide a relatively large amount of coating material at or near the center of a wafer to be coated and then to rapidly spin the wafer for a precisely controlled time and at a precisely controlled speed. Such spinning, although generally providing a coating of the substrate wafer having an acceptable thickness and uniformity, results in a great deal of wasted coating material as a relatively large amount of such material, in proportion to that remaining as a coating of the substrate, is expelled from the surface of the substrate. For example, some coating materials may cost as much as $1500 to $5,000 a liter. With spin coating an amount of material is deposited which may include coating material sufficient to allow for 90% of the material to be thrown off in the spinning process.

It should be appreciated that the current state of the art, utilizing spin coating, does not adequately address the need for applying coatings of relatively viscous coating material. Because these materials are much more reluctant to migrate in response to the centrifugal forces, higher spinning speeds may be required, thus resulting in greater amounts of expelled material. Likewise, in order to provide a uniform coating, i.e., adequately disperse any center accumulation or pooling of the thicker material, longer spin times may be required, also causing additional waste.

Similarly, spin coating does not lend itself to providing thick coatings or coating surfaces with severe topography. The spinning necessary to cause migration of the deposited pool of coating material generally leaves a very thin layer of coating material remaining on the substrate. If thicker coatings are required a different process must be utilized, thus necessitating additional equipment if both thick and thin coatings are to be used at a single facility, or multiple thin coats must be applied, also introducing typically undesired characteristics such as additional processing time and a stratified end product. Moreover, many of the wafers or substrates have a fairly high degree of surface topography or surface roughness of various features for which spin coating is not particularly well suited to provide uniform coverage of those severe features.

Additionally, such spinning results in the coating of the periphery or circumferential edge of the wafer, in addition to typically causing an edge bead, or area of slightly thicker coating at the edge of the wafer, to form. These edge beads and edge coatings must typically be removed in a subsequent processing step as they may gum up the hot plates and downstream systems if the coating material, such as resist, is left on the edge or has crept around the back side of the substrate during the spin operation. Therefore, the current art of spin coating of a wafer requires additional steps in order to clean the expelled material from equipment as well as to remove the edge coating and edge bead formed. For example, current coating processes may employ another fluid dispense system that lends itself to removing this unwanted coating material from the substrate therefore introducing additional cost and/or more production facility floor space.

A further drawback of the state of the art spin coaters is that they are not adapted, or adaptable, to accommodate a variety of substrate sizes. For example, due to the precise spin speeds which must be maintained in order to produce a coating of a desired thickness, a spin chuck, and it attendant spinning mechanism, may not be acceptable for use in spinning particular size substrates. Accordingly, various sizes of substrates may require a variety of spin chucks and their associated component.

Moreover, the equipment utilized in spin coating the substrate must be adapted to handle particular sizes of substrates. For example, as spinning necessarily casts off coating material, the spin mechanism must typically include a spin bowl to catch this material. This spin bowl will define the largest substrate which may be accommodated by the mechanism. Likewise, in order to introduce the coating material at or near the center of the substrate, a delivery mechanism must be adapted to pump coating material from a reservoir to the center of the substrate surface which, as the substrate sizes to be handled increases, affects this delivery mechanism.

Other constraints on the ability to adapt to various size substrates include the actual chuck utilized to hold the substrate for coating and spinning. One chuck design generally used in spin coating is a vacuum chuck, wherein the surface of the chuck includes vacuum orifices in order to draw down a substrate placed thereon and firmly hold the substrate for spinning. Accordingly, a substrate which is smaller than this chuck will result in coating material which is expelled from the substrate surface onto the chuck surface requiring cleaning prior to engaging subsequent substrates. Additionally, the coating material may be introduced into the vacuum system which, at the least, may cause later problems in establishing a proper vacuum and, because of this material's, and the solvents used in cleaning such materials, often volatile nature, may quite likely cause much more drastic results. Therefore, although a vacuum chuck having different vacuum positions that allow you to have the different form factors on it may not be practical for particular applications and/or for a particular range of substrate sizes.

Further, spin coating primarily lends itself to coating of circular objects, such as the typical silicon wafer. This limitation is due to balancing requirements of the substrate when spun at relatively high speeds as well as the windage problems resulting from spinning an irregular or other than circular shape.

Furthermore, as different size and/or dimension form factors of substrates are used, the coating apparatus must still achieve the same level of uniformity of the coating. Spin coating necessarily requires a longer time for coating of the outer edges of a large substrate than a small substrate. Accordingly, uniformness in coating the substrate may be difficult to attain. Irregular shapes, where it is not an equal distance from the center of the substrate to each outside edge, or all portions of the outside edge, compound this problem.

A still further drawback in the current state of the art is the time required to complete the coating of the substrate. Spin coating requires a particular amount of time, in addition to the time required to initially deposit the coating material upon the substrate, in order to cause the coating material to migrate fully across the surface. This time requirement is particularly prominent with more viscous coating materials because when spin coating a spinning action is used to spread the thick material from the center of the wafer out towards the outer edges and that process usually takes longer with the high viscosity fluids.

SUMMARY OF THE INVENTION

These and other objects, features and technical advantages are achieved by a system and method which utilizes extrusion of coating materials in applying a desired coating and is adaptable to accommodate various substrate types, form factors, and sizes ranging from squares to all different types of rectangles and circles. Preferably, the present invention utilizes a module that is easily adapted to different configurations.

The present invention utilizes an extrusion head in order to deposit coating material upon the surface of a substrate to be coated. Accordingly, precise thicknesses of coating material may be deposited without the waste associated with the aforementioned prior art spin coating method. For example, where 90% of the coating material initially deposited on a substrate is lost in spin coating, 95% or more of the coating material deposited by the preferred extrusion coating is utilized in coating square or rectangular substrates and approximately 79% of the coating material depicted by the preferred extrusion coating is utilized in coating circular substrates in one preferred embodiment of the present invention. The use of extrusion heads and chucks adapted for use in extrusion coating according to a preferred embodiment of the present invention are shown and described in the above referenced patent application entitled "Linear Extrusion Coating System and Method."

Moreover, extrusion coating according to the present invention is well suited for the application of relatively thick coatings as well as the application of viscous coating materials. Likewise, because the use of an extrusion coating head allows the controlled depositing of the coating material throughout the surface of the substrate, shapes and form factors other than circular substrates may be handled with ease.

A preferred embodiment of the present invention includes a cantilevered extrusion head mounting assembly in order to allow for the accommodation of various sized and shaped substrates. This design enables the support of the head to be suspended out over the substrate, which through the use of a very strong and stable cantilever bearing assembly, provides for the accommodation of various sizes, lengths and shapes of extrusion heads.

Advantages are realized in the preferred cantilever design, providing movement of an extrusion head sufficient to coat substrates, over that of other designs, such as a bridge configuration with bearings disposed on either side of the substrate. Specifically, with a bridge type configuration, when trying to accommodate different size substrates to be coated it becomes necessary to change out the whole frame assembly in order to span a larger substrate and to support a wider extrusion head. However, by utilizing a cantilever design, it is not necessary to provide that additional outside support. Therefore, redesign in the frame and support area to accommodate substrate sizes which may change from time to time may be avoided. Moreover, the cantilever design provides a more accessible working area.

In being able to reach the full size of a substrate placed on a holding chuck, various distances of travel may be required for an extrusion head depositing the coating material. Thus the preferred cantilevered design provides for a sufficient length of extrusion head travel to apply a coating to such substrates. Accordingly, by either restricting the travel of the extrusion head and/or discontinuing the extrusion of coating material from the extrusion head, smaller substrates may be accommodated by this design.

Furthermore, accommodating a relatively wide product requires the supports for the extrusion head to be positioned so as not to interfere with substrates having such widths. The preferred cantilevered design requires only a single mounting point for the extrusion head movement assembly. Accordingly, any width of material may be placed beneath such an apparatus and be coated provided the extrusion head is sufficiently sized to coat the substrate.

A preferred embodiment of the present invention utilizes a universal mounting bracket on the cantilever mounting portion that allows the installation of substantially any head of any length or configuration in order to accommodate the particular product being run. Preferably, the head mounting assembly is adapted to interface with a plurality of substrate processing station modules in order to allow configuring of modules for particular applications or to provide particular desired attributes. Where the module configuration of the coating apparatus is a relatively narrow footprint, as is achievable by the aforementioned cantilever design, it lends itself to building clusters of them to provide stand alone modules tied together through robotics and/or being controlled by one central computer. Such an arrangement provides advantages in allowing for improved throughput of processed substrates. Moreover, such a modular design provides for easily adapting a particular substrate processing system to be adapted for a variety of differing processes by simply removing one variety of the coating module and replacing it with a different variety of the coating module, i.e., the modules may be designed to easily interface with other processing equipment in order to provide "plug and play" type interchange and/or upgrade.

Preferably, the coating modules of the present invention include a number of configurations each adapted to have particular attributes which may be desirable depending upon the particular end goal of the coating application. These configurations may include a walking shim module, wherein a coating shim is provided to prevent edge bead and edge coating problems while adapted to allow cleaning of the shim without adversely affecting throughput, a continuous shim module, wherein a coating shim is provided to prevent edge bead and edge coating problems while adapted so as to not require cleaning of the used shim, a spin clean chuck module, wherein a chuck is adapted to provide improved extrusion coating of the substrate which may be easily cleaned by spinning, a ring clean chuck module wherein a ring is adapted to provide improved extrusion coating of the substrate which may be easily cleaned, and a extrude and spin module, wherein a chuck is adapted to both hold the substrate for extrusion as well as further coating processing with spinning. Spinning of the substrate may be omitted in producing the designed uniform coating according to the present invention.

Each of the above modules of the present invention have certain common features. For example, in order to provide for interchangeability as described above, each of the module configurations is disposed within a same basic frame size and structure. In the preferred embodiment, each module is provided with a fixturing plate, such as an "L" shaped plate or rectangular base plate, that mounts the extrusion head movement mechanism, such as the aforementioned cantilever mounting mechanism, providing extrusion head access to the substrate. Preferably extrusion head movement is linear and provided by a granite air bearing with a linear motor although other means may be utilized for providing precise control of extrusion head movement including a conventional bearing or another type of drive system, such as a ball screw or a belt drive.

Additionally, each module preferably includes an extrusion head mounting mechanism which mounts extrusion heads of various sizes on the cantilever arm. Accordingly, not only may different modules be utilized to provide particular desired attributes in coating, but so too may each module be adapted for various sizes of substrates to be coated.

Preferably, the fixturing plate includes stations for necessary maintenance of the extrusion head. For example, located on one side of the base plate described above is preferably a storage and cleaning station for the head. Moreover, there may be multiple stations such as a head servicing station where the extrusion head can be disassembled or material can be flushed from the head located adjacent to the storage and cleaning station. The locating of such stations within the module, whether actually a part of the fixturing plate or disposed separately, provides for the head to be located automatically above these stations in addition to the actual coating operation onto the substrate.

The preferred embodiment fixturing plate is mounted within the standard size module and preferably is configured in such a way that the remaining portion of the module is not occupied by the fixturing plate, i.e., the module provides a very open format such that other types of sub-assemblies or sub-modules can be integrated into the overall main module. This allows the introduction of the above mentioned shims, spin chucks, or cleanable rings, which may be added depending on the particular customer's requirements or the ultimate end use of the main module. Additionally, different size or different shape substrate can be accommodated by interchanging this sub-module which would preferably include the substrate mounting and the interface components to the robotic load, unload or automatic load, unload of the substrate.

In the preferred embodiment of the present invention the module includes the various componentry required to provide the desired coating of the substrate. This may include one or more solvent containers for supplying fluid up to the necessary components for head washing or maintenance, and may also include the main process fluid reservoir as well as the filtration and dispensing pumps that would be used to filter the process fluid and then ultimately dispense it up through the extrusion head onto the substrate. Accordingly, a preferred embodiment of the present invention includes, beneath the level of the L-shaped plate and the substrate fixturing sub-module, a lower cabinet where many of the solvents and process fluid that are required for the system are mounted. This cabinet may be exhausted to provide for the dissipation of harmful fumes. Of course, the disposition of the reservoirs, pumps, etcetera within a cabinet associated with the module of the present invention is optional. For example, where the module is to be associated with a larger system already providing the aforementioned componentry, the componentry may be remotely located, if desired.

Also, an electronics package will generally be required for the operation of the electrical and pneumatic components, the storage of process recipes, and the interface with the operator or with the host system in cases where this module is integrated into a main system. The electronics package may be located within this module, such as within the aforementioned cabinet. However, the electronics package, or a portion thereof, may be located elsewhere, such as above the module in an area where it may be more convenient to locate the electronics package or alternatively the electronics package may be in a remote location then connected by cables to the main coating module.

Preferably, the coating modules of the present invention are adapted to be integrated into certain systems, such as the TOK SS2 or TOK Sky Walk Automated Coating System available from TOK, Tokyo Ohka Kogyo of Tokyo, Japan. Additionally, or alternatively, the modules of the present invention are adapted to operate in stand alone mode. Likewise, the modules of the present invention are preferably adapted to be integrated into a cluster type or in line type of coating system. Accordingly, a single module may be utilized in a stand alone fashion until such time as processing demands require greater throughput and then the same module may be integrated with other processing equipment.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5A–5C show a substrate coating station module of the present invention having a spin clean chuck sub-module deployed therein;

FIG. 5D shows a recessed chuck of a preferred embodiment of the present invention;

FIG. 5E shows an edge bead removal head assembly of a preferred embodiment of the present invention;

FIG. 6D shows a chuck cleaning head assembly of a preferred embodiment of the present invention.

DESCRIPTION OF THE INVENTION

In understanding the concepts and features of the present invention, reference to specific embodiments is helpful. Accordingly, description of various preferred embodiments of the present invention are provided herein. However, it shall be appreciated that the present invention is not limited to the specific embodiments disclosed herein.

Figure 1A:
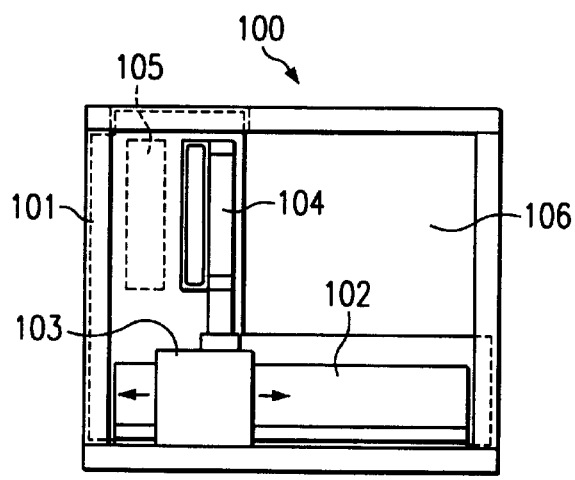
FIGS. 1A–1C show a substrate coating station module according to a preferred embodiment of the present invention.
Figure 1B:
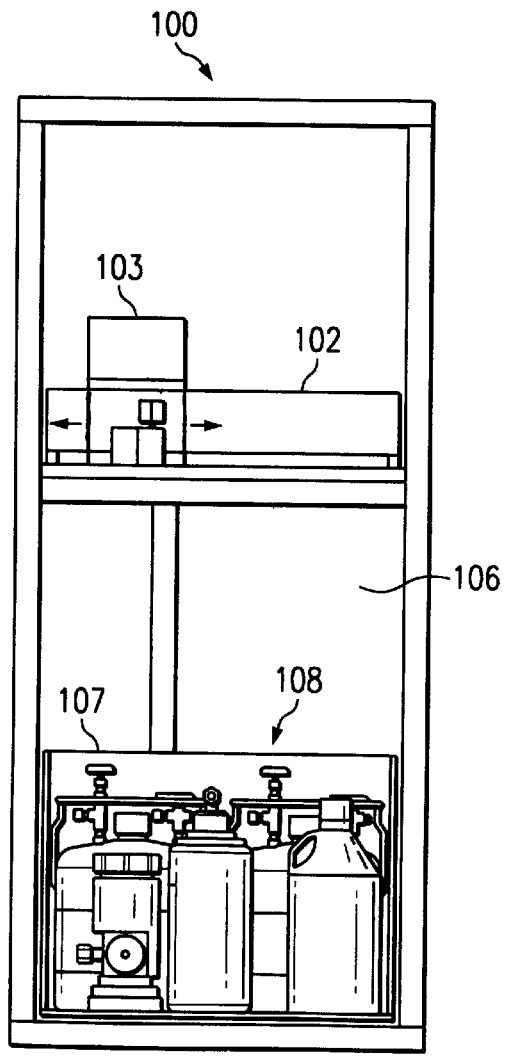
Figure 1C:
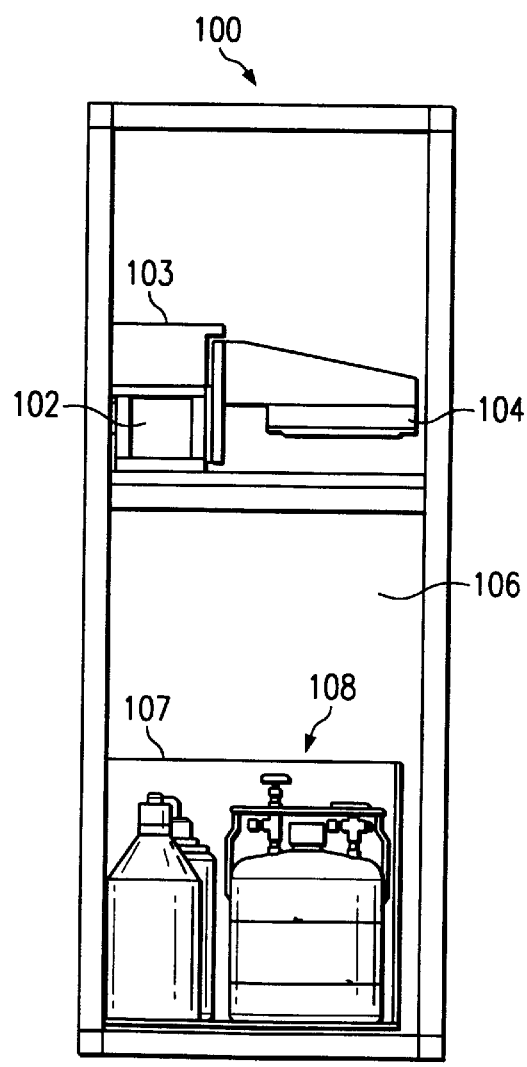

Directing attention to FIGS. 1A through 1C, coating module 100 according to the preferred embodiment of the present invention is shown. As can be seen in the plan view of FIG. 1A, the preferred embodiment includes fixturing plate 101 providing support for movement apparatus 102 for cantilever arm 103. Cantilever arm 103 provides movable support for extrusion head 104 disposed thereon.

Preferably, movement apparatus 102 includes an air bearing assembly providing sufficient linear motion of cantilever arm 103, in the direction of the arrows shown, and therefore linear movement of extrusion head 104, to traverse any size, shape, or form factor of substrate to be coated. In the preferred embodiment movement apparatus 102 is a granite air bearing with a linear motor allowing for precise and controlled movement of head 104 with respect to a substrate to be coated. Of course, other means may be utilized for providing extrusion head movement, including a conventional bearing or another type of drive system, such as a ball screw or a belt drive.

As shown in phantom in FIG. 1A, fixturing plate 101 may include station 105, within the movement range of extrusion head 104. Station 105 may be any number of stations, or combinations thereof, suitable for providing desired functionality with respect to extrusion head 104 and/or cantilever arm 103. For example, station 105 may be a cleaning station adapted to clean and prime an extrusion orifice of extrusion head 104. Likewise, station 105 may be a park position station providing support of extrusion head 104 and/or cantilever arm 103 for movement of module 100 or for removal of extrusion head 104 from cantilever arm 103, such as for replacing extrusion head 104 with a head having different attributes.

Also located within the movement range of extrusion head 104 is open space 106. This open space of the basic module unit of the present invention provides an area into which various apparatus adapted to provide handling of substrates for coating according to the needs of particular situations may be disposed. For example, apparatus, preferably in the form of sub-modules which may be interchangeably coupled to module 100, adapted to include the aforementioned walking shim feature wherein a coating shim is provided to prevent edge bead and edge coating problems while adapted to allow cleaning of the shim without adversely affecting throughput, continuous shim feature, wherein a coating shim is provided to prevent edge bead and edge coating problems while adapted so as to not require cleaning of the used shim, spin clean chuck, wherein a chuck is adapted to provide improved extrusion coating of the substrate which may be easily cleaned by spinning, ring clean chuck, wherein a ring is adapted to provide improved extrusion coating of the substrate which may be easily cleaned, extrude and spin feature, wherein a chuck or other form of substrate retainer is adapted to both hold the substrate for extrusion as well as further coating processing with spinning, or the like, may be disposed within space 106 of module 100.

Directing attention to FIGS 1B and 1C, module 100 of FIG. 1A is shown from the front and right side respectively. Accordingly, space 106 can be seen to provide an area below the operating position of extrusion head 104 into which the componentry of the above described apparatus may be disposed. As may be seen from the below discussion of preferred embodiment variations of these apparatus, varying amounts of space may be required to accommodate particular apparatus. Accordingly, a coating module may be provided according to the present invention which includes a space very different in size and shape than that shown in FIGS. 1B and 1C. However, as the preferred embodiment of the present invention is adapted to accommodate a variety of these apparatus, space 106 is provided large enough to accommodate the largest of the desired apparatus.

Also shown in FIGS 1B and 1C is cabinet 107 having componentry, shown generally as componentry 108, disposed therein. As with space 106, cabinet 107 is preferably adapted so as to provide a space large enough to accommodate the largest of the componentry associated with the desired apparatus. It should be appreciated, however, that module 100 may operate according to the present invention without providing cabinet 107 if desired, such as where this componentry is remoted or is provided by a host system into which module 100 integrates.

Although not shown, an electronics package is preferably associated with module 100. Such an electronics package may include control circuitry of motors, such as for the controlled movement of extrusion head 104, operation of pumps for moving coating material and/or cleaning solvents from cabinet 107 to extrusion head 104, operation of loading and ejection mechanisms (i.e., ejection pins) for automated loading and unloading of substrates, or the like. As the apparatus to be disposed in space 106 adapted to handle the substrates to be coated may include electronics particular to the apparatus, the electronics package may be associated with, or coupled to, the particular apparatus to be disposed within module 100. Accordingly, the electronics package may be removably mounted to module 100, such as within space 106, within cabinet 107, or even above the fixture plate and extrusion head assembly within the frame of module 100. Alternatively, the electronics package, or a portion thereof, may be remoted, such as where a central intelligence provides control for module 100 and a host system into which it is integrated.

Although preferably adapted to operate in a stand alone mode, module 100 is also preferably adapted to be integrated into preselected systems, such as by having dimensions compatible with such systems and/or service connections, i.e., pneumatic, electrical, and signal connections, adapted to couple with such systems. For example, module 100 may be adapted to interface with a particular station position of the TOK SS2 Automated Coating System available from TOK, Tokyo Ohka Kogyo of Tokyo, Japan.

Figure 2:
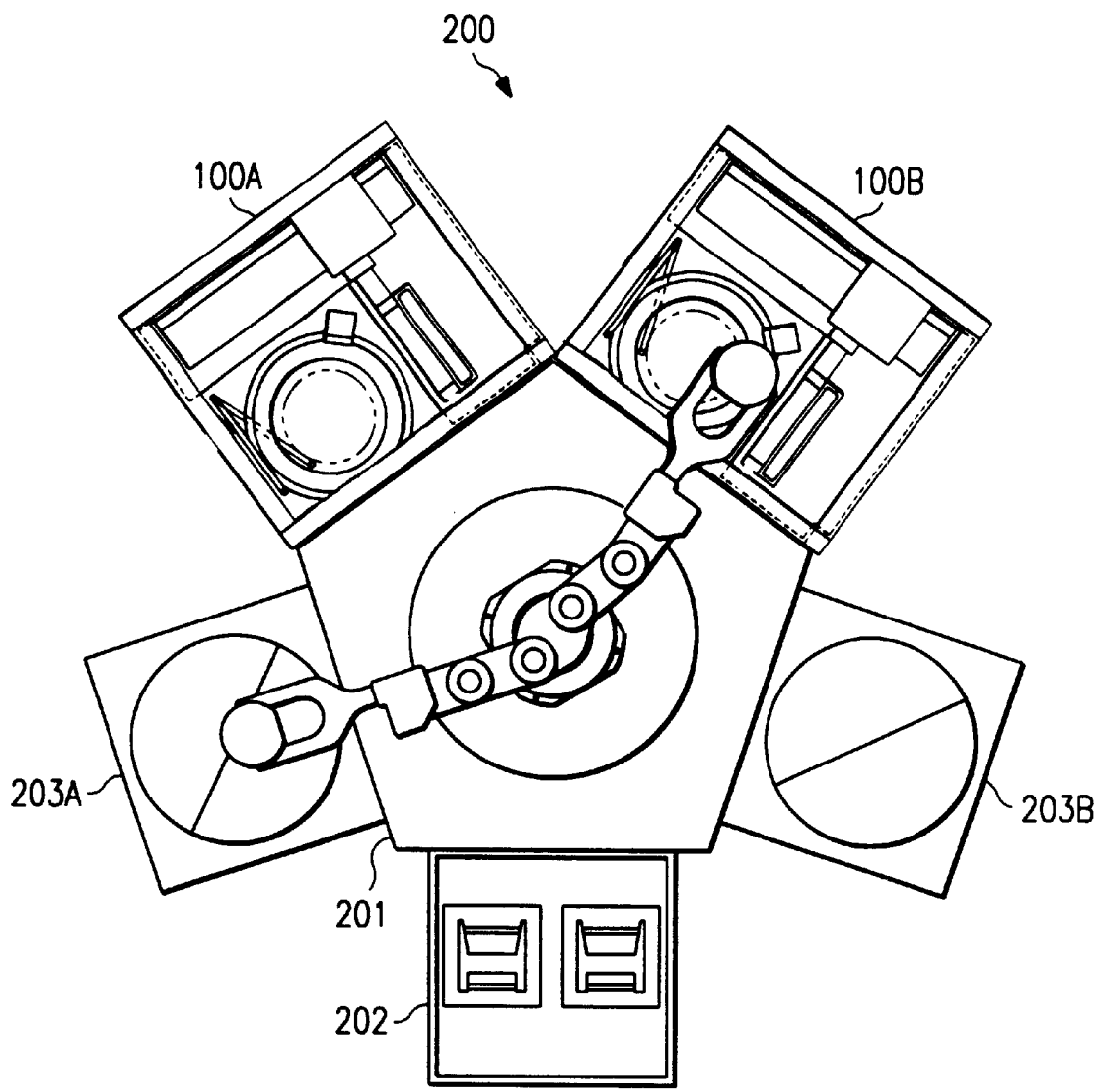
FIG. 2 shows a cluster arrangement of coating station modules of the present invention.

Additionally, or alternatively, module 100 may be adapted to be integrated into a cluster type or in line type of coating system including a plurality of such modules interconnected. Directing attention to FIG. 2, a cluster of interfaced modules is shown generally as cluster 200. In the cluster of FIG. 2, coating module 100A and coating module 100B, both substantially the same as module 100 of FIG. 1, are coupled to control and robotic system 201. It shall be appreciated that modules 100A and 100B may be adapted to process substrates in a similar fashion, i.e., each being adapted with a similar apparatus in space 106, or each may process substrates differently. Accordingly, throughput may be increased for a particular process by having multiple modules performing the same process. Likewise, a multi-step process may be completed more quickly by having multiple modules configured differently so as to provide different steps of the multi-step process.

It shall be appreciated that coating modules may not be the only modules required in a particular process. Accordingly, additional functionality may be provided by additional modules coupled to the cluster, as shown in FIG. 2. Here load/unload station 202 is provided to handle multiple substrates processed by cluster 200 and hot plate/cold plates 203A and 203B are provided for further processing of the substrates. The arrangement of the modules shown and their functionality are by way of example only and are not limitations of the present invention.

Having described the module of a preferred embodiment of the present invention, description of this module including variations of apparatus to provide processing of substrates to result in desired attributes is provided herein below. Directing attention to FIGS. 3A through 3C, module 100 having walking shim sub-module 300 disposed therein is shown.

Figure 3A:
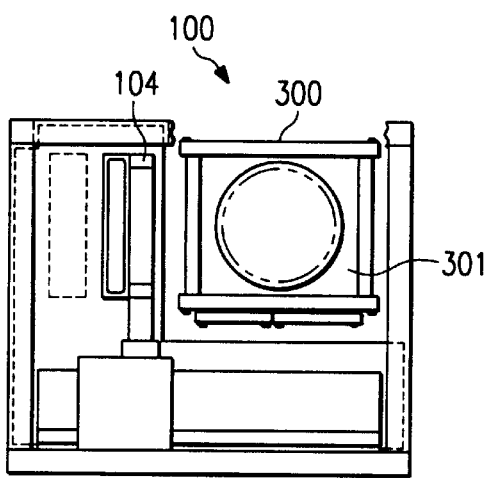
FIGS. 3A–3C show a substrate coating station module of the present invention having a walking shim sub-module deployed therein.
Figure 3C:
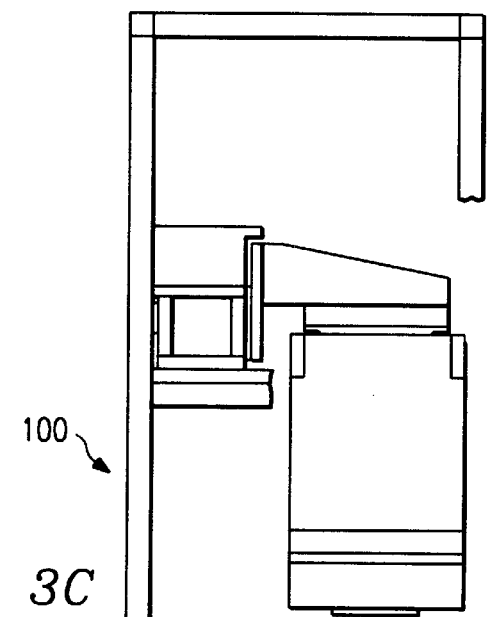
Figure 3B:
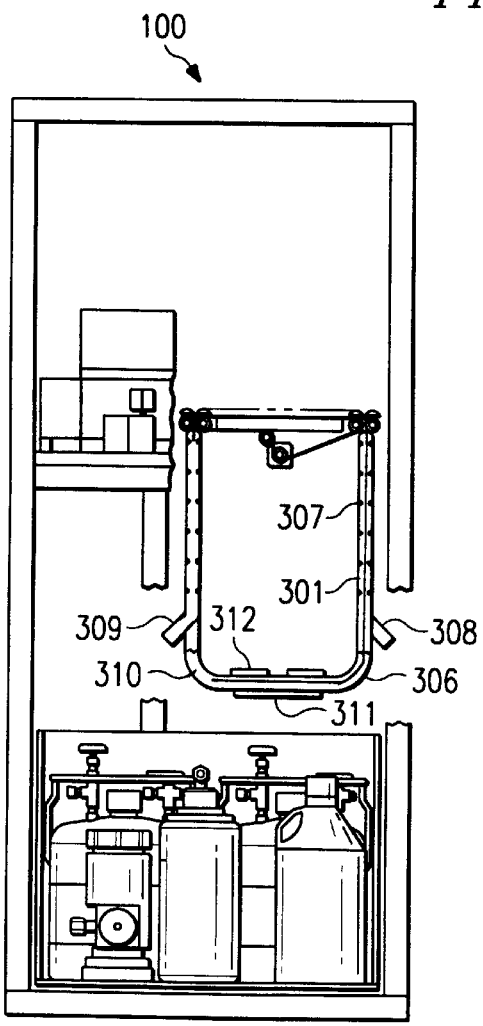
Figure 3D:
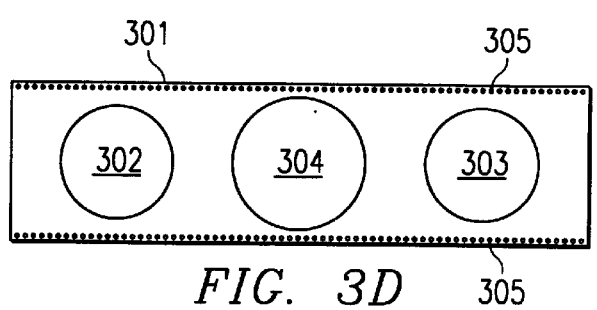
FIG. 3D shows the walking shim of a preferred embodiment of the present invention.

Shim 301, preferably a thin sheet of stainless steel or similar material, is shown engaged in sub-module 300 in FIG. 3A. Shim 301 is provided to interface with a substrate to be coated, a circular wafer in the embodiment illustrated in FIGS. 3A through 3D, in order to prevent edge beading and/or edge coating by masking the substrate while it is being processed. Directing attention to FIG. 3D, shim 301 is shown disengaged from sub-module 300. The three holes, holes 302–304, are shim positions for doing the masking. Holes 302 and 303 disposed at either end of shim 301 are smaller than hole 304 located in the center of shim 301. Hole 304, having a diameter sufficient to allow the substrate to be coated to pass there through, is positioned over the substrate while the substrate is being loaded and unloaded. Accordingly, by properly sizing and shaping hole 304, it may be positioned over the top of the chuck of sub-module 300 to protect it while the substrate is being transferred.

It shall be appreciated that masking holes 302 and 303 may be sized to provide a minimum overlap of the substrate to be coated in order to prevent the formation of edge beads or coating of the edges. Moreover, holes 302 and 303 may be shaped to provide a desired size and/or shape of coating material on the surface of the substrate. Furthermore, by exchanging shim 301 with one having different sized and/or shaped holes, different substrates may be accommodated by sub-module 300.

Controlled movement and registration of shim 301 may be provided through tractor feed perforations 305 shown along the longitudinal edges of shim 301. Additionally, or alternatively, position sensors, such as sensor switches, opto-eletronic devices, and/or Hall effect devices, may be utilized in controlling the motion/registration of shim 301.

When hole 304 is disposed in the working position (disposed to allow the substrate to pass there through the ends of shim 301 having smaller holes 302 and 303 are in positions within sub-module 300. Similarly, when either hole 302 or 303 is disposed in the working position, in addition to the other end of shim 300 being disposed within sub-module 300, the portion of shim 301 having hole 304 is in a position within sub-module 300. Disposing of portions of shim 301 within sub-module 300 may be seen in the front view of FIG. 3B, wherein shim 301 is positioned with hole 302 in the working position and the remaining portion of shim 301 disposed within tank assembly 306.

When any portion of shim 301 is disposed within tank assembly 306, it may be cleaned for subsequent use in masking a substrate to be coated. For example, when hole 304 is disposed in the working position, both holes 302 and 303 will be disposed in the upper portion of tank assembly 306 having spray nozzles 307 disposed therein. Preferably, while in this vertical position, either or both of holes 302 and 303 may be washed or treated with some material applied through nozzles 307. For example, where hole 303 has been just utilized in masking a substrate and hole 304 has been moved into the working position, hole 303 may be initially washed down by a spray from nozzles 307.

Where this initial cleaning utilizes a same chemical, or a compatible chemical as the subsequent bathing of shim 301, the liquid sprayed from nozzles 307 may be allowed to flow into the lower portion of tank assembly 306. In order to control the flow of liquids dispensed from nozzles 307, the preferred embodiment of the present invention includes shutters 308 (shown in the open position) and 309 (shown in the closed position) disposed on each side of tank assembly 306. Accordingly, when shim 301 is first walked in to tank assembly 306, the shutter disposed on that particular side of tank assembly 306 may be in the open position, both to allow any liquid sprayed by nozzles 307 in pre-cleaning shim 301 to flow into the lower portion of tank assembly 306 as well as to allow shim 301 to be further walked into tank assembly 306. However, after a portion of shim 301 having a masking hole therein has been walked fully into tank assembly 306, and therefore fully cleaned, as this portion of the shim is walked into the upper portion of tank assembly 306, the shutter may be placed in a closed position, thus sealing off the lower portion of tank assembly 306 and routing fluid to an exhaust position. This closed position may be utilized to allow treating of shim 301 with another chemical, such as a final rinse dispensed by nozzles 307, which is not compatible with the chemical utilized in the initial cleaning and/or the chemical which is pooled (solvent pool 310) in the lower portion of tank assembly 306.

Figure 3E:
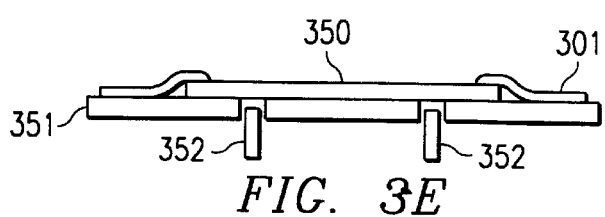
FIG. 3E shows the walking shim deployed on a substrate and chuck according to the present invention.

From the above discussion, it should be appreciated that walking shim sub-module 300 allows for a substrate to be loaded through hole 304, such as by placing a substrate on loading pins, such as pins 352 of FIG. 3E, which lower the substrate through hole 304 onto the chuck of sub-module 300, while holes 302 and 303 are disposed within tank assembly 306. Assuming hole 302 has just previously been utilized to mask a substrate, shutter 309 may be placed in the open position while nozzles 307 on that side of tank assembly 306 initially clean the portion of shim 301 associated with hole 302. Likewise, shutter 308 may be placed in a closed position while hole 303, having just been walked from the lower portion of tank assembly 306 where the portion of shim 301 associated with hole 303 was bathed in solvent pool 301, and nozzles 307 on that side of tank assembly 306 provide a final, neutralizing, or drying rinse.

Particularly with polymeric applications, incompatible chemicals may be utilized in cleaning the coating material from the shim. For example, the shim may be first washed off with NMP (n-methyl pyrrolidine) and then rinsed with IPA (isopropyl alcohol). In the embodiment of FIG. 3, the first step in cleaning may be spraying NMP on shim 301 to start loosening the polymeric material thereon. With the shutter open, NMP drains down into the NMP pool in the tank assembly. There may be a recirculating pump, for example, that instead of using fresh NMP, may be utilized to take NMP from the solvent pool, reticulate it and re-dispense it through the nozzles. This spray cleaning step helps start cleaning the shim, but it typically will not be sufficient to fully clean the shim. Thereafter, when the part of the shim that's been coated is walked all the way down into the tank assembly, it is immersed in the NMP pool. Accordingly, after its spray washing with NMP, the shim is now in NMP (which may be heated, if desired) which, with the aid of ultrasonics, loosens any remaining polymeric coating material.

When the shim has been washed and immersed, the shim is returned to the upper portion of the tank assembly for a second time. Then the shim has to be rinsed with IPA. However, IPA and the NMP cannot be mixed. Accordingly, the shutter door is moved to a closed position which blocks off the solvent pool. The EPA may be sprayed through either the same nozzles, for example a switch that switches the particular solution dispensed by the nozzles is used, or a different set of nozzles is used for the IPA spray. Because the shutter door is closed, the IPA rinses off the shutter and goes to a solvent drain and exhaust to a solvent trap. Drawing the IPA through the exhaust, such as through the use of vacuum, may be utilized to aid in drying the shim through the use of air flow across its surface.

Once a substrate has been loaded in the chuck of sub-module 300 as shown by substrate 350 loaded in chuck 351 of FIG. 3E, shim 301 may be moved such that freshly cleaned hole 303 is placed over the newly loaded substrate for masking and the above described cleaning process of the other masking hole takes place. In order to prevent damage to the surface of the substrate to be coated and/or the coating material placed thereon, the preferred embodiment of the shim assembly will move up so that it will pass over the top of the substrate. In the preferred embodiment, shim 301 and its associated feed rollers and tractor assembly will index up a small amount, approximately 10 millimeters, for any movement. This upward movement is preferably kept small in order to allow other portions of shim 301 to engage cleaning portions of tank assembly 306.

Accordingly, the mechanism will index to put the next hole over the top of the substrate to be lowered down into contact with the wafer and the coating process will start. Initially washed hole 302 is walked into the lower portion of tank assembly 306 for bathing in solvent pool 310. Once the newly loaded substrate, masked by hole 303, has been coated by movement of extrusion head 104, shim 301 may be again be moved such that hole 304 is positioned for loading and unloading of the substrate and the above described steps are again repeated.

Although described above with reference only to lowering a masking hole over the substrate to be coated, it shall be appreciated that the present invention may utilize various techniques to prevent the bleeding or wicking of coating material beneath the masking shim. For example, in a preferred embodiment of the present invention, the chuck holding the substrate for coating in sub-module 300 is a vacuum chuck. Accordingly, areas of the chuck beyond the outer edge of the substrate when engaged in the chuck are also provided with vacuum in order to draw down the shim, as shown by shim 301 being drawn down on chuck 351 of FIG. 3E, and form a tighter masking seal.

Figure 3F:
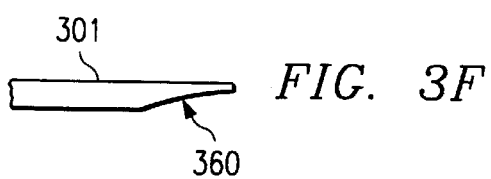
FIG. 3F shows a preferred embodiment tapered edge of shims of the present invention.

Additionally, in order to form a tighter seal and/or in order to present a smaller surface anomaly when engaged with the substrate, i.e., to avoid the thickness of the shim keeping the extrusion head too far away from the surface of the substrate, shim 301 is preferably provided with a tapered edge around masking holes 302 and 303 as shown in FIG. 3F. For example, in a preferred embodiment, shim 301 is a 3 to 10 thousandths thick stainless steel sheet with the edges tapered around the masking holes thinned down to approximately 25 microns so that the overlap of the shim over the wafer is very small. The entire shim is not provided at this reduced thickness in order to promote its handling, i.e., prevent wrinkling and injury by way of lacerations to persons handling the shim. Such a taper may be formed from a chemical etching of the shim and may include multiple etching steps in order to provide a desired taper and inside diameter thickness of shim 301.

In order to aid in cleaning of shim 301, the preferred embodiment of tank assembly 306 includes heater 311 and ultrasonic transducers 312 coupled thereto. Accordingly, heated liquid and/or ultrasonics may be used to do the cleaning. Additionally, or alternatively, there may be brush assemblies (not shown) disposed in tank assembly 306 to help remove material from shim 301.

It shall be appreciated that the cleaning cycle of the present invention may be performed for any duration deemed efficient. However, in order to provide maximum throughput, the preferred embodiment provides adequate cleaning of a portion of shim 301 in a time corresponding to the cycle time of completing the extrusion coating of a substrate. Accordingly, various aids to cleaning, such as the aforementioned heater, ultrasonic transducers, and/or brushes may be utilized depending on a type of coating material used and/or size of substrate to be coated in order to perform sufficient cleaning in the cycle time.

Figure 4A:
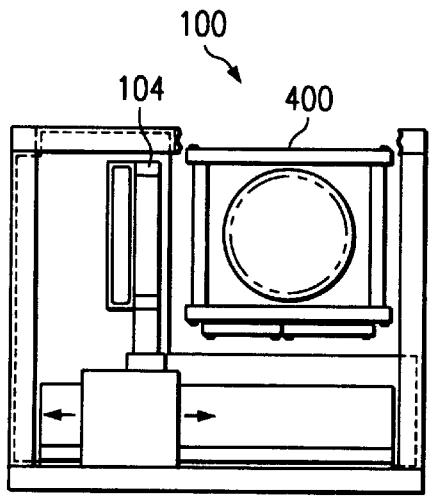
FIGS. 4A–4C show a substrate coating station module of the present invention having a continuous shim sub-module deployed therein.
Figure 4D:
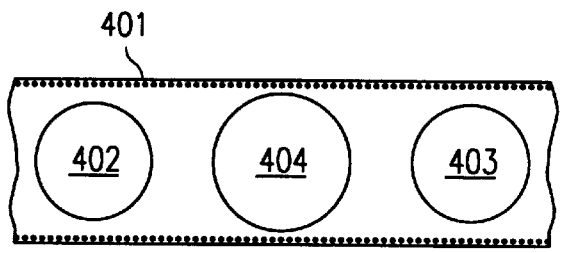
FIG. 4D shows a preferred embodiment of a continuous shim.
Figure 4B:
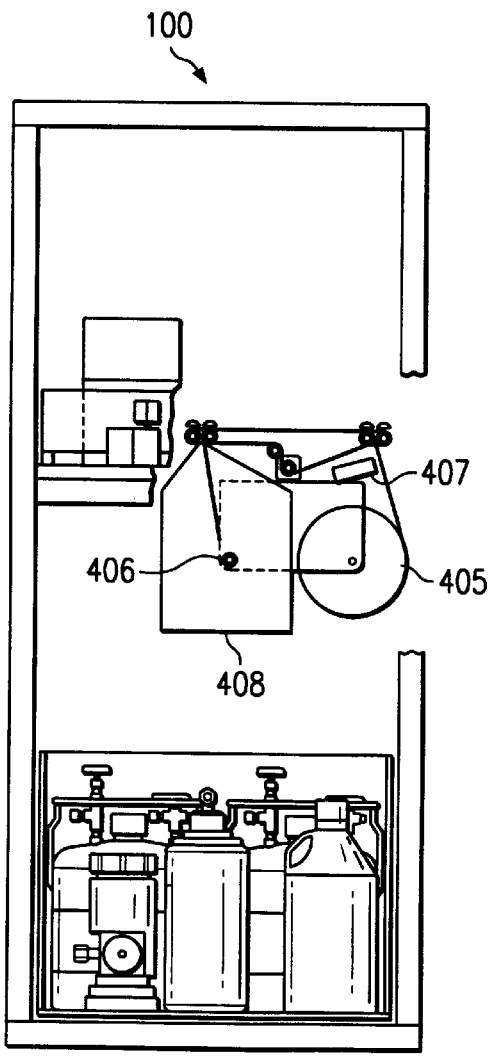
Figure 4C:
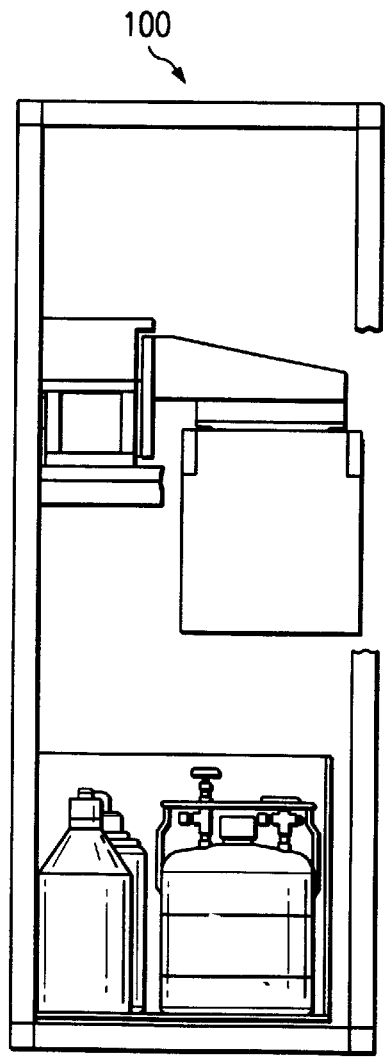

Directing attention to FIGS. 4A through 4C, module 100 having continuous shim sub-module 400 disposed therein is shown. Shim 401 is shown engaged in sub-module 400 in FIG. 4A. As with the walking shim of FIGS. 3A through 3D, shim 401 is provided to interface with a substrate to be coated, a circular wafer in the embodiment illustrated in FIGS. 4A through 4D, in order to prevent edge beading and/or edge coating by masking the substrate while it is being processed.

Directing attention to FIG. 4D, a portion of shim 401, preferably a sheet of Kapton or similar material, is shown disengaged from sub-module 400. The three holes, holes 402–404, are shim positions for doing the masking. Holes 402 and 403 are smaller than hole 404 located between holes 402 and 403. Holes 402 and 403 may include tapered edges as described above with respect to walking shim 301, if desired.

Hole 404, having a diameter sufficient to allow the substrate to be coated to pass there through, is positioned over the substrate while the substrate is being loaded and unloaded. Accordingly, by properly sizing and shaping hole 404, it may be positioned over the top of the chuck of sub-module 400 to protect it while the substrate is being transferred.

It shall be appreciated that masking holes 402 and 403 may be sized to provide a minimum overlap of the substrate to be coated in order to prevent the formation of edge beads or coating of the edges. Moreover, holes 402 and 403 may be shaped to provide a desired size and/or shape of coating material on the surface of the substrate.

Controlled movement and registration of shim 401 may be provided through tractor feed perforations shown along the longitudinal edges of shim 401. Because shim 401 is a continuous length of shim material, it is expected that drift may be experienced in the positioning of the masking holes if indexing and registration of these holes is left solely to the operation of the feed mechanism. Moreover, there are issues with respect to the degrading of the shim material itself over time, such as with the preferred embodiment of Kapton, so there are preferably interlocks provided in order that if the material is left for any period of time it will index automatically and continually roll to keep a reasonable amount of material on the roll. Accordingly, the preferred embodiment of the present invention includes optical position sensor 407 utilized in controlling the motion/registration of shim 401. Of course devices other than opto-electronic devices may be utilized, such as sensor switches, Hall effect devices, or the like.

As with the walking shim of FIGS. 3A through 3D, in order to prevent damage to the surface of the substrate to be coated and/or the coating material placed thereon, the preferred embodiment of the shim assembly will move up so that it will pass over the top of the substrate. In the preferred embodiment, shim 401 as well as supply reel 405 and take-up reel 406 will index up a small amount, approximately 10 millimeters, for any movement. Alternatively, shim 401, supply reel 405, and take-up reel 406 may be lifted a sufficient distance to facilitate the loading/unloading of the substrate without its passing through hole 404. Accordingly, a lesser amount of shim 401 may be utilized in coating a same number of substrate surfaces as all holes disposed therein may be masking holes.

The positioning sensor may also include a feature that allows not only sensing the position of the holes and/or that a correctly sized hole is positioned for the desired operation, but also to be able to discern whether the position of the shim assembly is as described above. Accordingly the sensor may be utilized as a safety interlock such that no action will occur unless the shim is in a positive location. For example, the sensor may detect that the shim is in the up position to allow a robot arm to engage the substrate for loading or unloading. Likewise, the sensor may detect that the shim is in the down position before starting extruding or in order to determine when to pull a vacuum on the shim. Alternatively, a vacuum sensing operation may be performed to determine the position of the shim whereby if the system is able to pull a vacuum, it is concluded that the shim is in the down position.

As can be seen in the front view of FIG. 4B, sub-module 400 utilizes a supply reel 405 of shim material which is drawn across the area in which the substrate is coated and collected by take-up reel 406. Accordingly, masking hole 402 may be disposed over the substrate, much as described above with reference to the walking shim of FIG. 3, for coating of the substrate. Thereafter shim 401 may be advanced to position hole 404 over the substrate. The substrate may be loaded/unloaded through the enlarged opening of hole 404. Thereafter shim 401 may be advanced to position hole 403 over a subsequently loaded substrate for coating. As the portion of shim 401 collected by take-up reel 406 will have coating material thereon, the preferred embodiment of the present invention includes exhaust/drip enclosure 408 utilized to contain the coating material and/or its vapors.

It should be appreciated that each masking hole of shim 401 is used a single time and, therefore, does not require cleaning for a subsequent coating step. Accordingly, the complexity of the aforementioned tank assembly, and its attendant concerns with the use and handling of cleaning solvents, may be avoided by this preferred embodiment of the present invention.

However, a single use of shim 401, depending on the material from which it is made, may be less cost effective than reusing the shim material after its cleaning. Of course, once shim 401 has been used, i.e., all masking holes have been used in masking a substrate, an alternative embodiment of the present invention may include the removal of shim 401 and its subsequent cleaning, such as at a specially designed and contained cleaning station or apparatus, in order to provide repeated use in coating substrates.

Directing attention to FIGS. 5A through 5C, module 100 having spin clean chuck sub-module 500 disposed therein is shown. Chuck 551 is preferably a recessed chuck, as shown in FIG. 5D, possibly including a mechanism for loading/unloading substrates to be coated, such as pins 552. Chuck 551 holds substrate 550, such as through vacuum, such that the entire surface to be coated is presented for coating. Additionally, through the use of the recessed area of the preferred embodiment, the surface of substrate 550 to be coated is substantially flush with an extrusion bead forming surface of chuck 551. Accordingly, extrusion head 104 may traverse the full area of substrate 550 for applying an extrusion coating thereon and utilize areas of chuck 551 to accept extruded coating material where the extrusion orifice of extrusion head 104 does not correspond to substrate 550.

It shall be appreciated that the recessed chuck design of the preferred embodiment allows for a substantially uniform coating to be extruded upon the surface of the substrate regardless of the shape of the substrate as the surface of chuck 551 which is flush with that of substrate 550 will allow for an extrusion bead to be formed and consistently maintained through the traversing of substrate 550 by extrusion head 104. Moreover, the recessed chuck design may be relied upon to provide at least limited protection from coating of the edge of substrate 550, as this edge is not substantially exposed when engaged in the chuck. Discouraging edge coating may be improved, if desired, through the addition of a positive pressure in the gap between the chuck and the edge of the substrate. Recessed chuck designs and their use in extrusion coating of substrates is described in further detail in the above referenced patent application entitled "Linear Extrusion Coating System and Method."

In operation, according to a preferred embodiment, a substrate is loaded into recessed chuck 551 of sub-module 500 where the top surface of the substrate is co-planar with the top surface of the surrounding recessed chuck. After the substrate is loaded into the recessed chuck, and preferably held with a vacuum, extrusion head 104 moves across and applies the coating to the substrate and portions of the chuck, i.e., areas where the substrate is not as wide as extrusion head 104.

It shall be appreciated that chuck 551 does not at all points have to correspond to the width of extrusion head 104. For example, chuck 551 may be of a minimum diameter, although greater than the diameter of the substrate, is less than the width of extrusion head 104 but is sufficient to achieve the desired coating result, specifically to eliminate any leading edge effect.

After the coating is applied and extrusion head 104 is returned to a home position, the substrate may either be unloaded with the coating or, alternately, further processing may occur, such as through the use of an edge bead removal nozzle assembly, such as EBR nozzle assembly 501 shown in FIG. 5A. As shown in the embodiment of FIG. 5A, EBR nozzle assembly 501 is provided on an independent arm allowing the EBR nozzle to move toward the outside diameter of the substrate. Thereafter, the substrate can be rotated slowly, such as by rotating chuck 551 through use of locating spindle 502 shown in FIG. 5B, while the edge bead removal process occurs.

Preferably, locating spindle 502 is a very accurate spindle. For example, locating spindle 502 is much more accurate than a typical spin coat chuck spindle as it is desired to hold the substrate very accurately in the horizontal plane for the extrusion process. Extrusion coating according to the preferred embodiment utilizes a very small gap between the extrusion head and substrate being coated. Therefore, it is desired to provide an extremely accurate top surface location which is very much co-planar with the plane in which the extrusion head moves across the substrate. Accordingly, spindle 502 preferably utilizes a precise and rigid bearing and shaft assembly for accurate location and dimensional accuracy of the chuck, although coupled to a relatively simple and low cost spin motor because the spinning itself does not require accuracy.

It should be appreciated that rotating of the substrate as described above with respect to the preferred embodiment of edge bead removal is different from a typical prior art spinning edge bead removal process because with prior art spin coating processes the edge bead process is performed on a film that has already been spun at high speeds for coating purposes. With the film resulting from spin coating, it may be spun at a higher speed without further moving the film. However, with an extruded film, this film typically being very wet i.e., having a very high solvent concentration, it should only be turned slowly until dried in order to prevent unwanted redistribution of the coating material.

Accordingly, in the preferred embodiment, a small edge bead removal nozzle assembly is utilized to perform that operation at a relatively low rotational speed. Preferably, EBR nozzle assembly 501 will contain not only a solvent dispensing mechanism, but will also contain a vacuum fixture that will draw away the solvent and the fluid (the actual processed fluid that's being removed from the edge of the substrate). As shown in FIG. 5E, EBR nozzle assembly 501 preferably includes nozzle 570, to introduce a bead removal solvent, and vacuum fixture 571, to collect the bead removal solvent and removed coating material.

Spin clean chuck sub-module 500 may include apparatus in addition to or in the alternative to EBR nozzle assembly 501. For example a service arm, such as pivotally mounted arm 503 shown in FIG. 5A, may be provided to operate on or with the substrate to be coated, the chuck, or other portion of a coating apparatus. In a preferred embodiment, service arm 503 is adapted to include solvent delivery nozzles for use in cleaning apparatus as described below with respect to chuck clean nozzle 603.

After processing of the substrate is completed, possibly including the above described optional edge bead removal process, the substrate is unloaded from the system for further processing. Thereafter, the chuck may be cleaned to remove coating material deposited thereon. In the preferred embodiment spin bowl 503 raises up around the chuck and there is a spin clean operation with chuck 551 being rotated at a sufficient speed to remove coating material, which is captured by spin bowl 503.

It shall be appreciated that spin cleaning of chuck 551 differs from prior art spin coating operations in that the spin rpm and general control does not have to be as accurate or as high of a speed as it would be for spin coat operation. In addition, the control of exhaust through the bowl is much less critical. Accordingly, the equipment utilized in the spin cleaning does not have to be nearly complex as that utilized for an actual spin coat.

It shall be appreciated that, although discussed as separate processes and utilizing separate components of sub-module 500, the edge bead removal process and chuck cleaning process may be combined into a single process and/or utilize common componentry. For example, EBR nozzle assembly 501 may not only include nozzle and vacuum apparatus to clean an edge bead from substrate 550, but may also include nozzle and vacuum apparatus to clean the surface of chuck 551, such as may be employed after removal of the substrate when chuck 551 is spun at a high speed. Likewise, edge bead removal and chuck cleaning may be combined in a single operation.

Figure 6A:
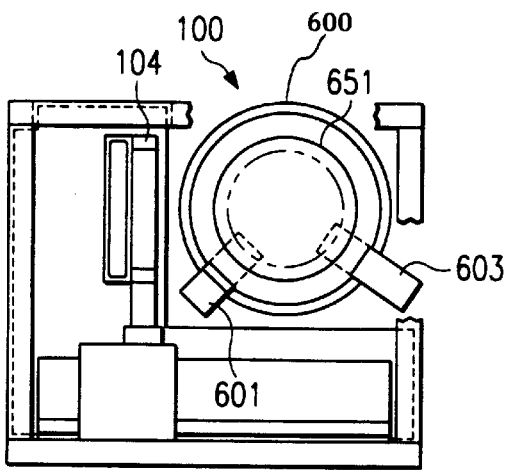
FIGS. 6A–6C show a substrate coating station module of the present invention having a ring clean chuck sub-module deployed therein.
Figure 6B:
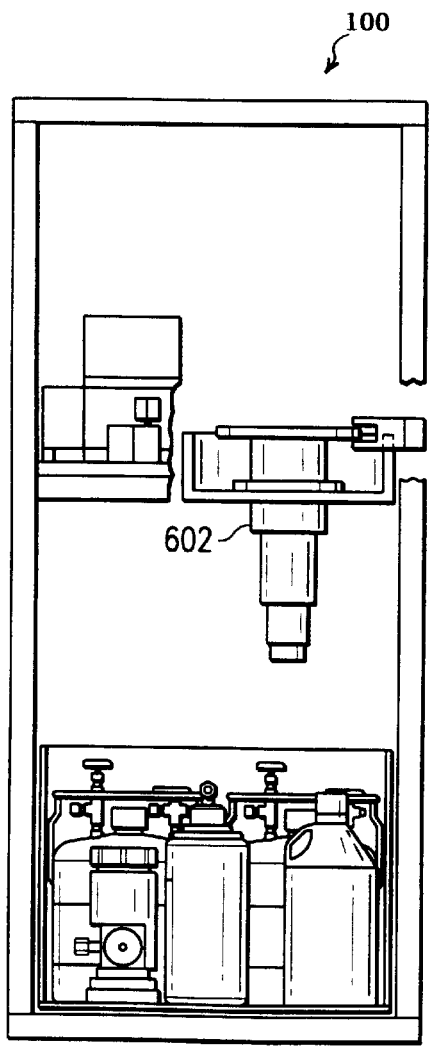
Figure 6C:
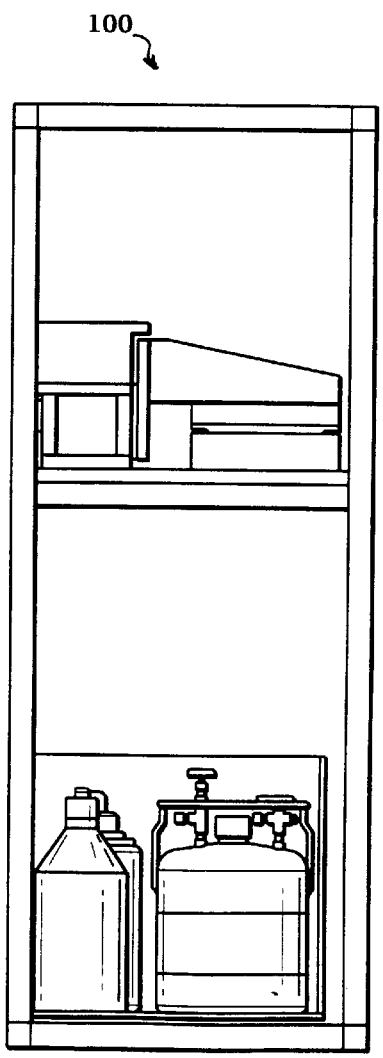

Directing attention to FIGS. 6A through 6C, module 100 having ring clean chuck sub-module 600 disposed therein is shown. As with chuck 551 of FIG. 5D, chuck 651 is preferably a recessed chuck, possibly including a mechanism for loading/unloading substrates to be coated, such as pins 552 of FIG. 5D. Chuck 651 holds a substrate to be coated, such as through vacuum, such that the entire surface to be coated is presented for coating. Additionally, through the use of the recessed area of the preferred embodiment, the surface of the substrate to be coated is held substantially flush with an extrusion bead forming surface of chuck 651. Accordingly, extrusion head 104 may traverse the full area of the substrate for applying an extrusion coating thereon and utilize areas of chuck 651 to accept extruded coating material where the extrusion orifice of extrusion head 104 does not correspond to the shape or size of the substrate.

As with the recessed chuck of the spin clean chuck embodiment of sub-module 500, the recessed chuck design of the preferred embodiment of the ring clean chuck design allows for a substantially uniform coating to be extruded upon the surface of the substrate regardless of the shape of the substrate as the surface of chuck 651 which is flush with that of the substrate will allow for an extrusion bead to be formed and consistently maintained through the traversing of the substrate by extrusion head 104. Moreover, the recessed chuck design may be relied upon to provide at least limited protection from coating of the edge of the substrate as this edge is not substantially exposed when engaged in the chuck. Discouraging edge coating may be improved, if desired, through the addition of a positive pressure in the gap between the chuck and the edge of the substrate.

In operation, according to a preferred embodiment, a substrate is loaded into recessed chuck 651 of sub-module

600 where the top surface of the substrate is co-planar with the top surface of the surrounding recessed chuck. After the substrate is loaded into the recessed chuck, and preferably held with a vacuum, extrusion head 104 moves across and applies the coating to the substrate and portions of the chuck, i.e., areas where the substrate is not as wide as extrusion head 104.

As with the spin clean chuck embodiment sub-module 500, chuck 651 does not at all points have to correspond to the width of extrusion head 104. For example, chuck 651 may be of a minimum diameter, although greater than the diameter of the substrate, is less than the width of extrusion head 104 but is sufficient to achieve the desired coating result, specifically to eliminate any leading edge effect.

After the coating is applied and extrusion head 104 is returned to a home position, the substrate may either be unloaded with the coating or, alternately, further processing may occur, such as through the use of an edge bead removal nozzle assembly, such as EBR nozzle assembly 601 shown in FIG. 6A, preferably configured as shown in FIG. 5E. As shown in the embodiment of FIG. 6A, EBR nozzle assembly 601 is provided on an independent arm allowing the EBR nozzle to move toward the outside diameter of the substrate. Thereafter, the substrate can be rotated slowly, such as by rotating chuck 651 through use of locating spindle 602 shown in FIG. 6B, while the edge bead removal process occurs. As with locating spindle 502 discussed above, preferably locating spindle 602 is a very accurate spindle, as it is desired to hold the substrate very accurately in the horizontal plane for the extrusion process.

As described above, the rotating of the substrate as described above with respect to the preferred embodiment of edge bead removal is different from a typical prior art spinning edge bead removal process because with prior art spin coating processes the edge bead process is performed on a film that has already been spun at high speeds for coating purposes. With the film resulting from spin coating, it may be spun at a higher speed without further moving the film. However, with an extruded film, this film typically being very wet i.e., having a very high solvent concentration, it should only be turned slowly until dried in order to prevent unwanted redistribution of the coating material.

Accordingly, in the preferred embodiment, a small edge bead removal nozzle assembly is utilized to perform that operation at a relatively low rotational speed. Preferably, EBR nozzle assembly, 601 will contain not only a solvent dispensing mechanism, but will also contain a vacuum that would draw away the solvent and the fluid (the actual processed fluid that's being removed from the edge of the substrate), as shown in the embodiment of FIG. 5E.

After processing of the substrate is completed, possibly including the above described optional edge bead removal process, the substrate is unloaded from the system for further processing. Thereafter, the chuck may be cleaned to remove coating material deposited thereon. However, in this embodiment, the chuck is preferably cleaned without high speed spinning or throwing off of the material, i.e., the coated ring of the chuck is cleaned at low speed. Accordingly, in the preferred embodiment, there is not a surrounding bowl to catch expelled material as none is expected to be spun off of the surfaces. Instead, there is a chuck cleaning assembly, shown as chuck clean nozzle 603.

In order to aid in cleaning chuck 651, the preferred embodiment of the present invention includes chuck clean nozzle 603, a preferred embodiment of which is shown in FIG. 6 having a plurality of nozzles 680, which may be controlled to introduce a cleaning solvent (and/or a drying substance, vacuum, or the like) to the surface of chuck 651 before, during, and/or after spin cleaning. Accordingly, chuck clean nozzle 603 may be operated to sweep across chuck 651 as chuck 651 is being spun in the cleaning process.

It should be appreciated that the preferred embodiment of chuck clean nozzle 603 utilizes a similar concept and componentry to that of EBR nozzle assembly 601 in that solvents can be dispensed onto this ring and then sucked away by a vacuum in a very self-contained way. Preferably, cleaning of the ring is performed after coating the substrate and after the substrate has been indexed up for unloading.

Although discussed as separate processes and utilizing separate components of sub-module 600, the edge bead removal process and ring cleaning process may be combined into a single process and/or utilize common componentry. For example, EBR nozzle assembly 601 may not only include nozzle and vacuum apparatus to clean an edge bead from the substrate, but may also include nozzle and vacuum apparatus to clean the surface of chuck 651. Accordingly, the ring of chuck 651 may be cleaned in a single pass of EBR nozzle assembly deploying to clean an edge bead from the substrate and then returning to a home position.

Figure 7A:
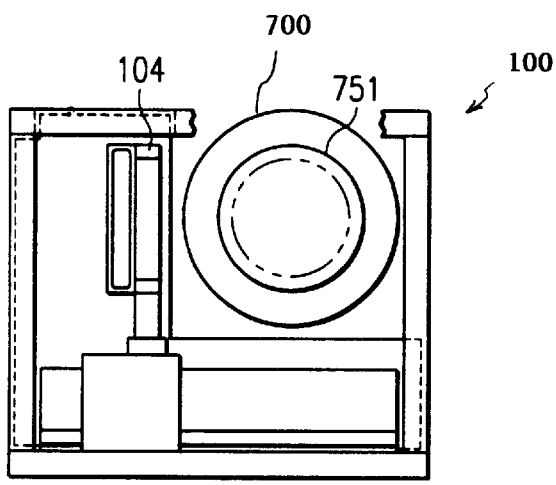
FIGS. 7A–7C show a substrate coating station module of the present invention having an extrude and spin sub-module deployed therein.
Figure 7B:
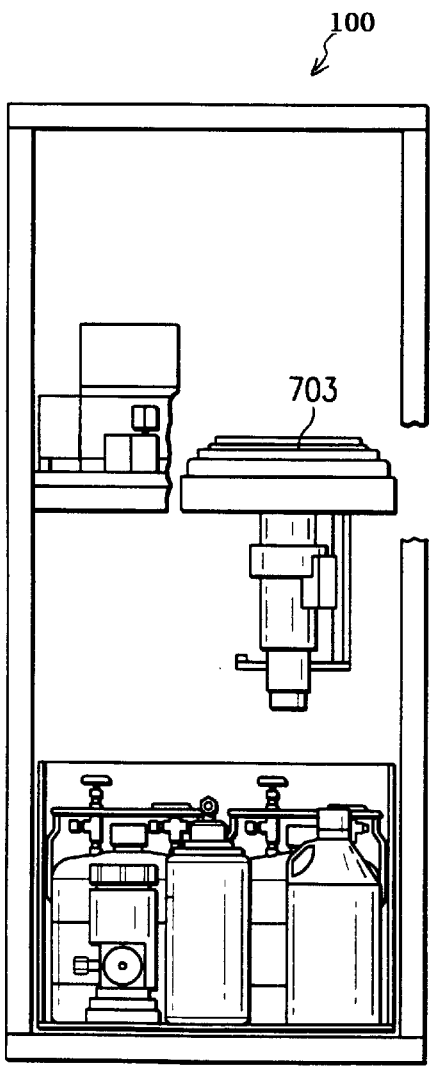
Figure 7C:
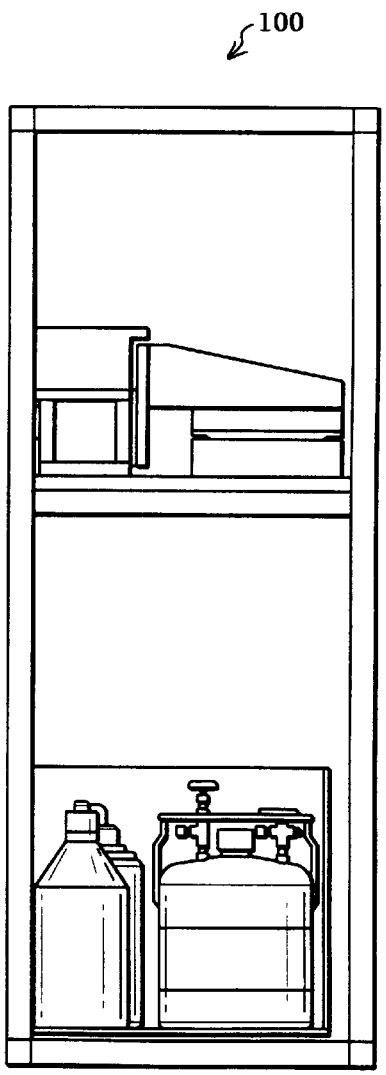

Directing attention to FIGS. 7A through 7C, module 100 having extrude and spin sub-module 700 disposed therein is shown. As with chuck 551 of FIG. 5D, chuck 751 is preferably a recessed chuck, possibly including a mechanism for loading/unloading substrates to be coated, such as pins 552 of FIG. 5D. Chuck 751 holds a substrate to be coated, such as through vacuum, such that the entire surface to be coated is presented for coating. Additionally, through the use of the recessed area of the preferred embodiment, the surface of the substrate to be coated is held substantially flush with an extrusion bead forming surface of chuck 751. Accordingly, extrusion head 104 may traverse the full area of the substrate for applying an extrusion coating thereon and utilize areas of chuck 751 to accept extruded coating material where the extrusion orifice of extrusion head 104 does not correspond to the shape or size of the substrate.

Although described with respect to a preferred embodiment recessed chuck, it shall be appreciated that a chuck, similar to that illustrated in FIG. 3E, not providing a recess to incarcerate the substrate may be utilized. Accordingly any undesired accumulation of coating material on the substrate caused by the extrusion head not corresponding with a coating surface at all points may (edge effects) be expelled from the substrate by the above described spinning of the substrate. However, it should be appreciated that such a chuck design may necessitate the use of edge cleaning which might otherwise be avoided through the use of the recessed chuck design.

As with the recessed chuck of the spin clean chuck embodiment of sub-module 500 through 5D and the ring clean chuck embodiment of sub-module 600, the recessed chuck design of the preferred embodiment of the extrude and spin design allows for a substantially uniform coating to be extruded upon the surface of the substrate regardless of the shape of the substrate as the surface of chuck 751 which is flush with that of the substrate will allow for an extrusion bead to be formed and consistently maintained through the traversing of the substrate by extrusion head 104. Moreover, the recessed chuck design may be relied upon to provide at least limited protection from coating of the edge of the substrate as this edge is not substantially exposed when engaged in the chuck. Discouraging edge coating may be improved, if desired, through the addition of a positive pressure in the gap between the chuck and the edge of the substrate.

In operation, according to a preferred embodiment, a substrate is loaded into recessed chuck 751 of sub-module 700 where the top surface of the substrate is co-planar with the top surface of the surrounding recessed chuck. After the substrate is loaded into the recessed chuck, and preferably held with a vacuum, extrusion head 104 moves across and applies the coating to the substrate and portions of the chuck, i.e., areas where the substrate is not as wide as extrusion head 104.

As with the spin clean chuck embodiment of sub-module 500 and the ring clean chuck embodiment of sub-module 600, chuck 751 does not at all points have to correspond to the width of extrusion head 104. For example, chuck 751 may be of a minimum diameter, although greater than the diameter of the substrate, is less than the width of extrusion head 104 but is sufficient to achieve the desired coating result, specifically to eliminate any leading edge effect.

After the coating is applied and extrusion head 104 is returned to a home position, spin bowl 703 raises up around the chuck, or alternatively the substrate and chuck are lowered into the bowl, and the substrate is then further processed by high speed spinning at a predetermined speed or speeds for a predetermined time in order to provide a desired thickness and uniformity of coating film. It shall be appreciated that the spin bowl assembly of FIGS. 7A through 7C is substantially the same as those of spin coating equipment in that the substrate is high speed spin processed, thus necessitating control over exhausting, windage, and fluid containment. However, spin bowl 703 is specifically adapted to provide sufficient access to the substrate by extrusion head 104 as well as to accommodate the preferred embodiment recessed chuck. Accordingly, sub-module 700 may incorporate a pre-existing spin bowl from an OEM manufacturer which has been integrated the sub-module/module to provide for extrude and spin.

Advantages in utilizing the extrude and spin process of this embodiment of the present invention may be realized with respect to the use of thinner or lower viscosity materials or where the overall target thickness is less than is achievable by an extrude only process. The final film thickness is affected by the spin speed, the flow of exhaust through the system, and other parameters that are typical of spin coat processes. Therefore, more reliance is placed upon the design of the spin bowl assembly in providing the desired results. Accordingly, the spin bowl of sub-module 700 will be more complicated than the simple spin bowl of sub-module 500.

Preferably, after further processing by spinning, the substrate is unloaded and a spin clean operation is performed on the chuck. Spin cleaning may utilize apparatus such as the chuck clean nozzle assemblies of FIGS. 5A or 6A. Of course, where a chuck is utilized which does not present a surface receiving coating material, the spin clean process described may be avoided.

It should be appreciated that the above described modules provide great benefit in the art of coating substrates. For example, utilizing spin coating technology, sub-module 700 described above allows for a particular user accustomed to spin coating to easily transition into the use of extrusion technology as the module is somewhat of a hybrid. Accordingly, the user will be able to utilize familiar equipment, materials, and processes to produce improved results in coating substrates. Similarly, where a user has various films to be applied, coating apparatus optimized for each particular film may be utilized by simply replacing modules and/or sub-modules of the present invention. Likewise, maintenance becomes simplified as modules and/or sub-modules may be interchanged, such as from a spare set standing by.

A further advantage of the coating designs of the present invention is that they may be utilized to make films repeatably uniform across substrate after substrate at least in part due to the use of extrusion for precision delivery of coating material to the substrate. Moreover, as the sub-modules shown and described above are already are adapted to provide unrestricted access to the substrate by the extrusion head, it is possible to set up a control system that in real time looks at and measures the thickness of the film that is applied.

For example, by utilizing optical measurement techniques, such as by deploying optical sensors similar to that illustrated in FIG. 4B directed toward the surface of the substrate receiving the coating, the thickness of the film may be measured such as by measuring reflected/refracted light. Additionally or alternatively, sensors, such as sensor 407, may be employed to monitor the delivery rate of the coating material. This sensor may be deployed on a mechanism which may be controllably moved into juxtaposition with the substrate. For example, the sensor may be disposed upon the extrusion head assembly or EBR nozzle assembly described above.

The measurements made by the sensor may be intelligently interpreted, such as by comparing the measured parameters to a knowledge base, and, preferably in real time, adjusting coating parameters, such as by changing delivery speeds or amounts of coating material, changing spin speeds or durations, or the like, to ensure uniform coating from one substrate to another. Alternatively, or where such coating parameter adjustments are ineffective, this system will preferably shut further processing off and notify an operator of a fault condition. Accordingly, if an unacceptable coating is made, only a single such defective coating results.

It shall be appreciated that such real time measurements are typically not possible in prior art spin coating for a number of reasons. Initially, it is very difficult in spin coating apparatus to deploy a measurement sensor close enough to the substrate surface to make accurate measurements, as in a big spinning bowl there are solvents and material moving around as well as the substrate itself spinning at a high speed. This problem is compounded by the fact that state of the art spin coating tools deploy a cover over the substrate such that this cover rotates with the substrate to reduce the effects of windage. Moreover, the spinning is such a dynamic process that the fluids are spreading out and very quickly and they're moving around such that it is difficult to get a very accurate measurement. Additionally, the ideal situation is to control the process as it is occurring to provide a desired result. In spin coating technology this would require controlling either the final spin speed or the final spin duration. However, by the time actual adjustments to these parameter are made, i.e., spinning up or down the substrate, it is very likely too late to accomplish the desired result.

Although the present invention and its advantages have been described in detail, it should be understood that various changes, substitutions and alterations can be made herein without departing from the spirit and scope of the invention as defined by the appended claims.

What is claimed is:

1. A system for providing a coating having desired characteristics on a substrate, said system comprising:
   a movable extrusion head mounting apparatus providing sufficient movement to allow extrusion coating of a substrate, wherein said extrusion head mounting apparatus provides cantilevered support of said extrusion head;
   a chuck adapted to retain said substrate, wherein said chuck provides said substrate a predetermined distance from said cantilevered extrusion head in order to allow a film of coating material having a predetermined thickness to be extruded onto said substrate, wherein said chuck is a recessed chuck having a recessed area adapted to incarcerate said substrate, and wherein said recessed chuck provides a surface substantially co-planar with a surface of said substrate to be coated;
   a shim assembly operating in cooperation with said chuck, wherein said shim assembly includes a masking shim adapted to mask at least a portion of said substrate when said film of coating material is extruded, a supply reel holding a first portion of said masking shim and a take-up reel holding a second portion of said masking shim; and
   said shim assembly further including a lifting mechanism adapted to provide a gap between said masking shim and a surface of said substrate to be coated such that said masking shim does not engage said substrate during movement of a portion of said masking shim from said supply reel to said take-up reel.

2. The system of claim 1, wherein said gap is sufficient to allow loading of said substrate without passing through said masking shim.

3. A system for providing a coating having desired characteristics on a substrate, said system comprising:
   a movable extrusion head mounting apparatus providing sufficient movement to allow extrusion coating of a substrate, wherein said extrusion head mounting apparatus provides cantilevered support of said extrusion head;
   a chuck adapted to retain said substrate, wherein said chuck provides said substrate a predetermined distance from said cantilevered extrusion head in order to allow a film of coating material having a predetermined thickness to be extruded onto said substrate, wherein said chuck is a recessed chuck having a recessed area adapted to incarcerate said substrate, and wherein said recessed chuck provides a surface substantially co-planar with a surface of said substrate to be coated; and
   a shim assembly operating in cooperation with said chuck, wherein said shim assembly includes a masking shim adapted to mask at least a portion of said substrate when said film of coating material is extruded, wherein said shim comprises;
   a plurality of holes disposed therein, wherein a first type of hole of said plurality of holes is a masking hole sized and shaped to correspond to a coating desired to be deposited on said substrate, and wherein a second type of hole of said plurality of holes is a pass-through hole sized and shaped to allow said substrate to pass through said shim when loading and unloading from said chuck.

4. The system of claim 3, wherein a hole of said second type of hole is disposed between two holes of said first type of hole.

5. The system of claim 3, wherein said shim assembly comprises:
   a tank assembly adapted to initially clean a portion of said masking shim when said masking shim is positioned to allow said substrate to be loaded and unloaded through said pass-through hole, and wherein said tank assembly is adapted to further clean said portion of said masking shim when said masking shim is positioned to mask said substrate.

6. The system claim 5, wherein said tank assembly comprises:
   an upper tank portion having cleaning nozzles disposed therein;
   a lower tank portion; and
   a shutter assembly adapted to isolate said upper tank portion from said lower tank portion.

7. The system of claim 6, wherein said tank assembly further comprises:
   a heater coupled to said lower tank portion to provide heating to cleaning solvent pooled in said lower tank portion.

8. The system of claim 6, wherein said tank assembly further comprises:
   an ultrasonic transducer coupled to said lower tank portion to provide assistance in cleaning said masking shim when disposed in said lower tank portion.

9. A modular apparatus for extruding a coating having desired characteristics on a substrate, wherein said modular system is adapted to be interfaced as a coating station in a host substrate processing system, said apparatus comprising:
   a modular chassis having a configuration adapted to couple to said host system;
   a movable extrusion head mounting apparatus coupled to said chassis providing support for an extrusion head;
   a substrate handling assembly having a substrate retainer disposed therein, wherein said substrate handling assembly includes a masking shim adapted to mask at least a portion of said substrate when said substrate is retained by said substrate retainer so as to provide a coating having desired characteristics on said substrate as said extrusion head extrudes said coating onto said substrate; and
   wherein said substrate retainer provides vacuum to draw said masking shim to said substrate when said masking shim is engaged to mask said at least a portion of said substrate.

10. The apparatus of claim 9, wherein said substrate handling assembly comprises:
    a supply reel holding a first portion of said masking shim; and
    a take-up reel holding a second portion of said masking shim.

11. The apparatus of claim 9, wherein said substrate handling assembly further comprises:
    a lifting mechanism adapt ed to provide a gap between said masking shim and a surface of said substrate to be coated such that said masking shim does not engage said substrate during movement of a portion of said masking shim from said supply reel to said take-up reel.

12. The apparatus of claim 11, wherein said gap is sufficient to allow loading of said substrate without passing through said masking shim.

13. The apparatus of claim 12, wherein said masking shim comprises:
    at least a first via sized and shaped to correspond to a coating desired to be deposited on said substrate;
    at least a second via sized and shaped to allow said substrate to pass through said masking shim when loading and unloading from said chuck; and at least a third via sized and shaped to correspond to said coating desired to be deposited on said substrate.

14. The apparatus of claim 13, wherein said shim assembly comprises:
    a tank adapted to clean a portion of said masking shim including said first via when said masking shim is positioned to allow said substrate to be loaded and unloaded through said second via, said tank also adapted to clean a portion of said masking shim including said third via when said masking shim is positioned to allow said substrate to be loaded and unloaded through said second via.

15. The apparatus of claim 14, wherein said tank is adapted to further clean said portion of said masking shim including said first via when said masking shim is positioned to mask said substrate with said third via.

16. The apparatus of claim 14, wherein said tank comprises:
    an upper tank portion having cleaning nozzles disposed therein;
    a lower tank portion; and
    a shutter assembly adapted to isolate said upper tank portion from said lower tank portion.

17. A method for providing a film having a desired thickness on a surface of a substrate, said method comprising the steps of:
    providing a chassis having attributes compatible with a host system into which said chassis is to be integrated, said chassis also having a movable extrusion head apparatus disposed thereon;
    selecting a particular substrate handling assembly of a plurality of substrate handling assemblies, wherein ones of said substrate handling assemblies provide different substrate coating attributes;
    coupling said selected substrate handling assembly to said chassis within the travel of said extrusion head;
    raising a masking shim above a substrate retainer;
    passing said substrate through a via provided in said masking shim and aligned with said substrate retainer; and
    operating said movable extrusion head apparatus in combination with said selected substrate handling assembly to provide said film on said surface of said substrate.

18. A method for providing a film having a desired thickness on a surface of a substrate, said method comprising the steps of:
    providing a chassis having attributes compatible with a host system into which said chassis is to be integrated, said chassis also having a movable extrusion head apparatus disposed thereon;
    selecting a particular substrate handling assembly of a plurality of substrate handling assemblies, wherein ones of said substrate handling assemblies provide different substrate coating attributes;
    coupling said selected substrate handling assembly to said chassis within the travel of said extrusion head;
    loading said substrate onto said selected substrate handling assembly;
    engaging a masking shim over said substrate;
    passing said extrusion head over said substrate to provide a film having a desired thinkness on said substrate;
    disengaging said masking shim from said substrate; and
    cleaning said masking shim during unloading of said substrate from said selected substrate handling assembly.

19. A method for providing a film having a desired thickness on a surface of a substrate, said method comprising the steps of:
    providing a chassis having attributes compatible with a host system into which said chassis is to be integrated, said chassis also having a movable extrusion head apparatus disposed thereon;
    selecting a particular substrate handling assembly of a plurality of substrate handling assemblies, wherein ones of said substrate handling assemblies provide different substrate coating attributes;
    coupling said selected substrate handling assembly to said chassis within the travel of said extrusion head;
    loading said substrate onto said selected substrate handling assembly;
    engaging a masking shim over said substrate;
    passing said extrusion bead over said substrate to provide a film having a desired thinkness on said substrate;
    disengaging said masking shim from said substrate; and
    advancing said masking shim such that a portion of said masking shim previously engaged over said substrate is collected by said selected substrate handling assembly.

20. A system for providing a coating having desired characteristics on a substrate, said system comprising:
    a movable extrusion head mounting apparatus providing sufficient movement to allow extrusion coating of a substrate, wherein said extrusion head mounting apparatus provides cantilevered support of said extrusion head;
    a chuck adapted to retain said substrate, wherein said chuck provides said substrate a predetermined distance from said cantilevered extrusion head in order to allow a film of coating material having a predetermined thickness to be extruded onto said substrate; and
    a shim assembly operating in cooperation with said chuck, wherein said shim assembly includes a masking shim adapted to mask at least a portion of said substrate when said film of coating material is extruded, wherein said shim comprises:
    a plurality of holes disposed therein, wherein a first type of hole of said plurality of-holes is a masking hole sized and shaped to correspond to a coating desired to be deposited on said substrate, and wherein a second type of hole of said plurality of holes is a pass-through hole sized and shaped to allow said substrate to pass through said shim when loading and unloading from said chuck.

21. The system of claim 20, wherein said shim assembly comprises:
    a supply reel holding a first portion of said masking shim; and
    a take-up reel holding a second portion of said masking shim.

22. The system of claim 21, wherein said shim assembly further comprises:
    a lifting mechanism adapted to provide a gap between said masking shim and a surface of said substrate to be coated such that said masking shim does not engage said substrate during movement of a portion of said masking shim from said supply reel to said take-up reel.

23. The system of claim 20, wherein said shim assembly further comprises:
    a lifting mechanism adapted to provide a gap between said masking shim and a surface of said substrate to be coated such that said masking shim does not engage said substrate during movement of a portion of said masking shim.

24. The system of claim 23, wherein said shim assembly comprises:

a tank assembly adapted to initially clean a portion of said masking shim when said masking shim is positioned to allow said substrate to be loaded and unloaded through said pass-through hole, and wherein said tank assembly is adapted to further clean said portion of said masking shim when said masking shim is positioned to mask said substrate.

25. The system of claim 20, wherein said shim assembly comprises:

a tank assembly-adapted to initially clean a portion of said masking shim when said masking shim is positioned to allow said substrate to be loaded and unloaded through said pass-through hole, and wherein said tank assembly is adapted to further clean said portion of said masking shim when said masking shim is positioned to mask said substrate.

26. The system of claim 25, wherein said tank assembly comprises:

an upper tank portion having cleaning nozzles disposed therein;

a lower tank portion; and a shutter assembly adapted to isolate said upper tank portion from said lower tank portion.

27. The system of claim 25, wherein said tank assembly comprises:

an upper tank portion having cleaning nozzles disposed therein;

a lower tank portion; and a shutter assembly adapted to isolate said upper tank portion from said lower tank portion.

* * * * *